United States Patent [19]

Yeh

[11] 4,451,349
[45] May 29, 1984

[54] ELECTRODE TREATMENT FOR PLASMA PATTERNING OF POLYMERS

[75] Inventor: James T. Yeh, Katonah, N.Y.

[73] Assignee: International Business Machines Corporation, Armonk, N.Y.

[21] Appl. No.: 486,629

[22] Filed: Apr. 20, 1983

[51] Int. Cl.³ .................... C23C 15/00; C23F 1/00
[52] U.S. Cl. ............................... 204/298; 156/345
[58] Field of Search ................ 204/192 E, 298; 156/345

[56] References Cited

U.S. PATENT DOCUMENTS 4,199,650  4/1980  Mirtich et al. ............. 204/192 E
4,243,476  1/1981  Ahn et al. ................. 204/192 E
4,341,616  7/1982  Nagatomo et al. ......... 204/192 E Primary Examiner—John F. Niebling
Attorney, Agent, or Firm—Carl C. Kling

[57] ABSTRACT

This patent specification describes a technique for protectively coating the electrodes in a plasma patterning device so as to minimize the effect of backscattering of electrode material.

The potentials present in a patterning chamber are such that electrode sputtering material may occur. If the material of the electrode where the sample is mounted (RIE mode) or the material of the counterelectrode (plasma etch mode) of the reaction chamber is not etchable in the etchant present, electrode material can be sputtered off, backscattered on the polymer surface, and cause incomplete etching.

Polymer films, patterned in fine dimensions by masking and etching, are widely used in microelectronics. If backscattered material present in the etch area cannot be etched as fast as the polymer film, the back-scattered material on the polymer film surface will cause partial masking and incomplete etching, leaving spikes of polymer.

Coating the electrode with the same polymer, or with a photoresist or different polymer of corresponding etch rate, precludes such incomplete etching; the etched hole is very clean, without spikes. The coating on the electrodes may be very thick so as not to require frequent recoating.

9 Claims, 2 Drawing Figures

4,451,349

ELECTRODE TREATMENT FOR PLASMA PATTERNING OF POLYMERS

BACKGROUND OF THE INVENTION

1. Field of the Invention

This invention relates to techniques for the patterning of polymers by an oxidizing etch in RF plasma, for precise applications such as those used in microelectronic circuits, and more particularly to a protective coating of polymer or photoresist on electrodes to eliminate problems due to backscattering of electrode materials.

2. Description of Related Art

The techniques for patterning of polymers have been widely studied in the microelectronic circuits technology. Various wet and dry etch techniques have been used and described in publications. Techniques for maintaining the etching chambers free of pollutants are common; protective masks and protective photoresists and a host of other protective mechanisms have been described.

Representative of the techniques available is the technique described in U.S. Pat. No. 4,341,616, M. Nagatomo et al, Dry Etching Device, July 27, 1982. The Nagatomo et al patent specification describes a dry etching device including in the path of the etchant a resin coating of the same material as the etchant, so as to replenish the etchant material consumed during the process. The Nagatomo et al patent specification does not address the backscattering problem, and of course does not hint at the problem solution by coating electrodes with material having an etch rate corresponding to that of the material being etched, nor by any other technique.

SUMMARY OF THE INVENTION

The invention is a technique for protectively coating the electrodes in a plasma patterning device so as to minimize the backscattering of electrode materials. Polymer films, patterned in fine dimensions, are widely used in microelectronics. Polyimide, for example, may be patterned by masking and etching in an oxygen reactive ion etching process. If the masking material cannot be etched as fast as the polymer film, the backscattering and deposition of the masking material onto the polymer film surface will cause partial masking and leave polymer residues. If the masking material itself is etched to gaseous species in the plasma, such incomplete etching should not occur. However, if the material of the electrode where the sample is mounted (RIE mode) or the material of the counterelectrode (plasma etch mode) of the reaction chamber is not etchable in oxygen plasma, the electode material can be sputtered off, backscattered on the polymer surface and cause incomplete etching.

Coating the electrode with the same or similar polymer or photoresist except where the sample is located avoids such incomplete etching; the etched hole is very clean, without polymer residues. The coating on the electrodes may be very thick so as not to require frequent recoating.

An advantage of the technique is uniformity of process and elimination of the loading effect. Because there is a relatively large amount of the polymer present (both on the sample and on the electrodes) there is a similar bulk of polymer from batch to batch, and there is little process change due to the number or size of samples loaded within a batch.

The foregoing and other objects, features and advantages of the invention will be apparent from the more particular description of the preferred embodiments of the invention, as illusteated in the accompanying drawings.

DESCRIPTION OF THE PREFERRED EMBODIMENT

Figure 1:
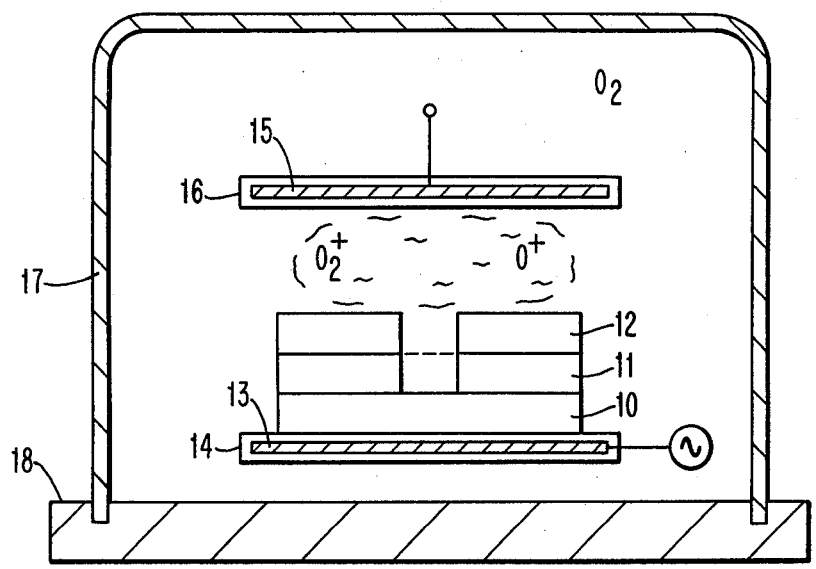
FIG. 1 shows a reaction chamber incorporating the coated electrodes.

FIG. 1 illustrates a reaction chamber incorporating the coated electrodes of the invention, with a substrate 10, coated with polymer layer 11 and mask 12 mounted in place and shown at the completion of a successful etching step. Substrate 10, polymer layer 11 and mask 12 are shown greatly enlarged for clarity; actual dimensions are very small. The area of electrode 13 surrounding substrate 10 is coated with protective polymer layer 14. The reaction chamber wall 17 and base 18 enclose the reaction chamber, enclosing the oxygen plasma. The plasma etchant may include other gases in addition to oxygen or instead of oxygen, depending upon the etch rate desired, the material to be etched, and other parameters of the process.

Figure 2:
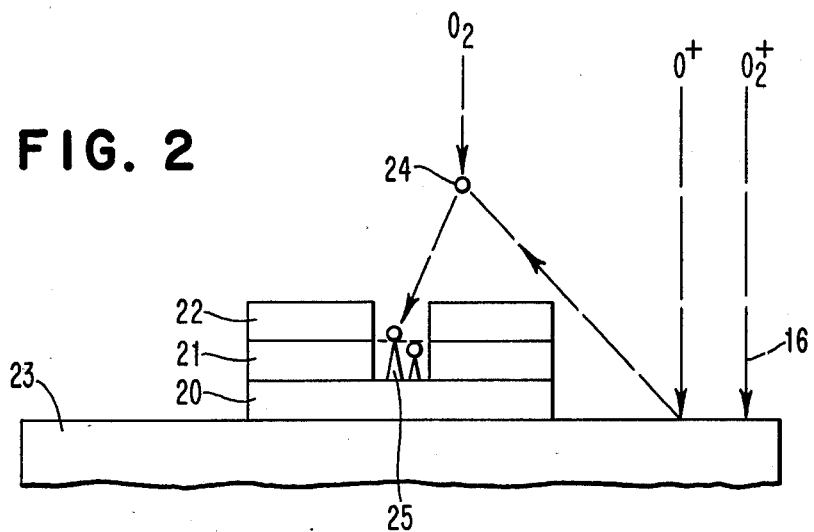
FIG. 2 illustrates the problem of incomplete etching caused by backscattering.

FIG. 2 illustrates the backscattering problem, which is minimized by the treatment described in this patent specification. Substrate 20 is coated with polymer film 21 and mask 22. During oxygen plasma treatment, O+ or $O_2+$ ions striking an electrode cause scattering of a particle 24 of electrode material; an active particle, such as an oxygen molecule, strikes particle 24 of electrode material and backscatters particle 24 onto the unmasked etch area of sample substrate 20. The transferred electrode material particle 24 forms a tiny mask which results in a spike 25 of unremoved polymer.

Further etching is not appropriate to remove the spike, since additional backscattering may occur during the further etching, and since the further etching may pit the substrate.

The materials used for coating the electrodes should be matched to the materials used for coating the samples, and to the materials used in the masks. If the masking material itself is etched to gaseous species, incomplete etching should not occur as a result of mask backscattering. However, if the material of the electrode where the sample is mounted (RIE mode) or the material of the counterelectrode (plasma etch mode) is not etchable to gas in oxygen plasma, the electrode material can be sputtered off the electrode onto the mask, backscattered amd deposited on the polymer surface within the opening in the mask, causing the spikes typical of incomplete etching.

The electrode must be conductive. The electrode coating may be of the same order of magnitude (not thicker than) the dark space in the plasma, or on the order of a millimeter. This upper limit is very thick as contrasted to the thin films which are to be etched. The preferred electrode coating, however, is a 50 micron coating of (poly)para-xylylene polymer, for RF plasma etching at 13.56 MHz, etching 2–5 microns thickness of (poly)para-xylylene from the sample, etching 20 minutes at a power rating of 0.3 watt/square centimeter in continuous oxygen flow at 50 milliTorr with the substrate at room temperature. (Poly) para-xylylene is a generic name for a polymer family, normally known by the trade designation "parylene," marketed by Union Carbide.

In the case of (poly)para-xylylene polymer, the coating on the electrodes may be the same as the film to be etched, and, since the coating on the electrodes may be much thicker than the coatings used on the sample to be etched, there is little likelihood that the protective coating on the electrodes will be etched through prior to completion of the etching of the polymer sample.

In the case of etching of (poly)para-xylylene polymer using masks made of a photoresist such as AZ1350J and electrode coating of the same photoresist, the etch rate of the photoresist is comparable to (similar to or slightly higher) than the etch rate of the polymer and thus does not result in the false masking which might cause spikes.

Other materials with similar etch rates, such as Riston TM thick film photoresist and Kapton TM polyimide polymer, may also be used.

Variations of the preferred embodiments may be incorporated, so long as the electrodes are coated with protective materials which do not form false masks, without departing from the spirit and scope of the invention, as pointed out in the following claims, so long as the protective materials etch at rates similar to the materials being removed from the sample.

What is claimed is:

1. Polymer etching apparatus, for patterning a film of polymer on a sample, including a reaction chamber having an electrode, portions of which electrode are in the vicinity of the sample being etched, characterized by:

a coating, on portions of electrode in the vicinity of the sample being etched, which portions are to be exposed to accelerated particles which cause sputtering of electrode material, of a layer of material of the same material as the material being etched,
    whereby the coating on the electrode etches at a rate comparable to the etch rate of the film to be etched from the surface of the sample, eliminating the effect of backscattering of electrode material onto the etch areas of the sample.

2. Apparatus according to claim 1, wherein said coating is (poly)para-xylylene having an etch rate corresponding to the etch rate of the film on the sample to be etched.

3. Apparatus according to claim 1, wherein said coating is photoresist having an etch rate corresponding to the etch rate of the film on the sample to be etched.

4. Apparatus according to claim 1, wherein said coating is polyimide polymer having an etch rate corresponding to the etch rate of the film on the sample to be etched.

5. Apparatus according to claim 1, wherein said coating is (poly)para-xylylene and the film on the sample to be etched is (poly)para-xylylene.

6. Apparatus according to claim 4, wherein said coating is polyimide polymer and the film on the sample to be etched is polyimide polymer.

7. Apparatus according to claim 1, wherein said coating is aproximately 50 microns in thickness.

8. Polymer etching apparatus, for patterning a film of polymer on a sample, including a reaction chamber having an electrode, portions of which electrode are in the vicinity of the sample being etched, characterized by:

a coating, on portions of electrode in the vicinity of the sample being etched, which portions are to be exposed to accelerated particles which cause sputtering of electrode material, of a layer of different material having an etch rate similar to the etch rate of the material being etched.

9. Apparatus according to claim 8 wherein said coating is approximately 50 microns in thickness.

* * * * *